United States Patent [19]

Shieh et al.

[11] Patent Number: 5,641,611
[45] Date of Patent: Jun. 24, 1997

[54] METHOD OF FABRICATING ORGANIC LED MATRICES

[75] Inventors: Chan-Long Shieh, Paradise Valley, Ariz.; Hsing-Chung Lee, Calabasas, Calif.

[73] Assignee: Motorola, Schaumburg, Ill.

[21] Appl. No.: 517,223

[22] Filed: Aug. 21, 1995

[51] Int. Cl.$^6$ ................ B05D 1/32; G03C 5/56
[52] U.S. Cl. ................ 438/35; 430/23; 430/29; 430/315; 430/324; 430/321; 437/80; 437/89; 437/905; 437/944; 257/40; 257/89; 257/79; 427/468; 427/487; 427/66; 427/68; 427/69; 427/155; 427/162; 427/251; 427/261; 427/615; 427/282; 438/99; 438/38
[58] Field of Search ................ 437/1, 80, 89, 437/905, 944; 257/40, 79, 89, 88; 427/468, 466, 487, 66, 68, 69, 99, 155, 162, 256, 259, 261, 265, 282; 430/314, 315, 320, 321, 324, 23, 24, 29

[56] References Cited

U.S. PATENT DOCUMENTS

| | | | |
|---|---|---|---|
| 4,459,321 | 7/1984 | Kim | 427/255.7 |
| 4,469,719 | 9/1984 | Martin | 427/282 |
| 4,599,790 | 7/1986 | Kim et al. | 148/DIG. 143 |
| 4,728,519 | 3/1988 | Tanimoto | 427/66 |
| 4,771,017 | 9/1988 | Tobin et al. | 148/DIG. 100 |
| 4,883,770 | 11/1989 | Dohler et al. | 437/80 |
| 5,105,238 | 4/1992 | Nikaido et al. | 357/19 |
| 5,276,380 | 1/1994 | Tang | 313/504 |
| 5,349,203 | 9/1994 | Hanazato et al. | 257/40 |
| 5,473,047 | 12/1995 | Shi | 528/310 |

FOREIGN PATENT DOCUMENTS 58-68835  4/1983  Japan ................ 427/68

OTHER PUBLICATIONS

Elliot, David. "Integrated Circuit Fabrication Technology", ©1982 pp. 26–33.
IBM Tech. Discl. Bull. vol. 27, No. 5, (Oct. 1984) pp. 3026–3027.

Primary Examiner—Martin Angebranndt
Attorney, Agent, or Firm—Eugene A. Parsons

[57] ABSTRACT

Items of material are patterned on a substrate by forming a layer of photoresist on the substrate and a layer of metal on the photoresist. The photoresist is patterned to define an opening exposing a portion of the substrate and the metal is patterned to define an aperture smaller than the opening so as to divide the exposed surface of the substrate into shadow areas and a non-shadow area. A first material system is evaporated generally perpendicular to the aperture to form a first organic light emitting diode on the surface of the substrate in the non-shadow area and second and third material systems are evaporated at angles to the aperture to form second and third organic light emitting diodes in the shadow areas. Passivation material is evaporated perpendicularly onto the first diode and at the angle onto the second diode.

18 Claims, 5 Drawing Sheets

METHOD OF FABRICATING ORGANIC LED MATRICES

FIELD OF THE INVENTION

The present invention pertains to methods of fabricating items of one or more material systems on a substrate and passivating the items.

BACKGROUND OF THE INVENTION

At the present time, organic light emitting diodes (LED) are becoming very popular because of the large number of materials that are available as well as the relatively low cost of the organic materials and the ease of producing the materials in a workable form. However, one of the main difficulties with organic LED displays comes in the patterning of the organic material into separate LEDs.

One proposed method of patterning to form strips of organic material includes the use of vertical shadow masks, or upright walls, with organic material evaporated and angularly directed at the walls to form the separate strips. Additional information on this method of fabricating organic LED displays is disclosed in U.S. Pat. Nos. 5,276,380, 5,294,869, and 5,294,870.

The problem with most of these fabricating methods is that they are only viable for crude dimensions. Also, the upright walls are relatively difficult to form and position correctly. Further, because all of the various color devices are fabricated in an integrated process, many of the steps in these fabricating processes produce overlapping layers that can reduce efficiency of the final devices.

Also, organic light emitting diodes are sensitive to the presence of oxygen and water vapor in the ambient air and must, therefore, be hermetically sealed for proper operation and a useful longevity. Conventional hermetic seals, including metal cans, thick patterned metal and continuous insulating barrier layers are generally too large and cumbersome for large matrices. Further, once the organic materials are in place they are sensitive to high temperatures and it is generally difficult to find low temperature dielectrics that are a good hermetic seal.

Accordingly, it would be desirable to devise a fabrication process in which an organic light emitting diode display, and especially a color display, can be easily, conveniently and accurately produced and passivated.

It is a purpose of the present invention to provide a new and improved method of fabricating organic LED matrices.

It is also a purpose of the present invention to provide a new and improved method of passivating organic LED matrices and the like.

It is another purpose of the present invention to provide a new and improved method of fabricating and/or passivating organic LED matrices which is relatively easy and inexpensive.

It is still another purpose of the present invention to provide a new and improved method of fabricating organic LED matrices which is capable of producing relatively accurate items of material for high resolution displays.

It is a further purpose of the present invention to provide a new and improved method of fabricating and/or passivating organic LED matrices which is capable of producing matrices with reduced weight and thickness.

It is a further purpose of the present invention to provide a new and improved method of fabricating and passivating organic LED matrices in one lithography and using a single integrated mask.

SUMMARY OF THE INVENTION

The above problems and others are at least partially solved and the above purposes and others are realized in a method of patterning items of material on a supporting substrate. The substrate includes a base with a conductive layer thereon covered by an insulating layer except for cavities therein exposing portions of the conductive layer. The method includes forming a first layer of material on the surface of a substrate overlying the cavities in the insulating layer and a second layer of material on the first layer of material. The first layer of material is formed to define an opening therein with a first transverse dimension exposing a portion of the surface of the substrate including the cavities and the second layer of material is formed to define an aperture therethrough with a second transverse dimension, smaller than the first transverse dimension and positioned generally coaxially with one of the cavities. The second layer of material is positioned to overlie a portion of the exposed surface of the substrate in the opening so as to divide the exposed surface of the substrate into a shadow area including one of the cavities and a non-shadow area including a second of the cavities. A first material system is deposited generally perpendicular to the aperture to form an item of the first material system on the surface of the substrate in the non-shadow area and overlying the one cavity and a second material system is deposited at an angle to the aperture to form an item of the second material system on the surface of the substrate in the shadow area and overlying the second cavity.

The above substrate, including the deposited items and the shadow mask, are passivated in a similar fashion. Passivation material is evaporated from a distally located source, in a direction generally perpendicular to the aperture in the shadow mask, to form a passivation cover on the deposited items. When additional items are deposited in the shadowed areas, passivation material is evaporated at an angle to the aperture, to form a passivation cover on the additional items. Dithering one of the distally located source or the substrate about the perpendicular direction and/or the angle may be required to provide complete passivation.

BRIEF DESCRIPTION OF THE DRAWINGS

Referring to the drawings.

DESCRIPTION OF THE PREFERRED EMBODIMENTS

Figure 1:
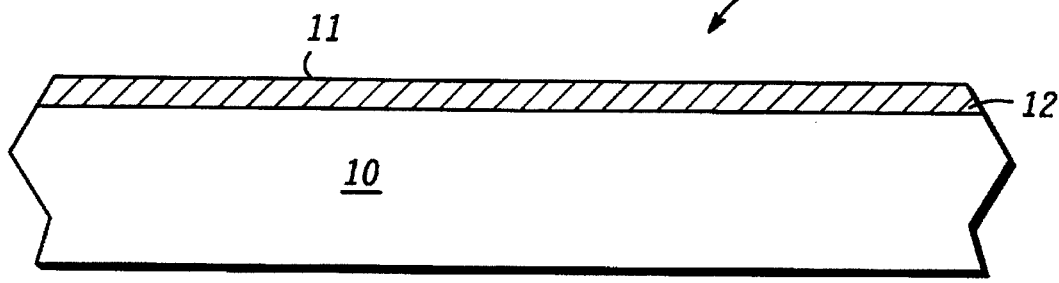
FIGS. 1–5 are simplified sectional views illustrating several steps in the preparation of a mask for use in a fabrication process in accordance with the present invention.

Turning now to the drawings, FIGS. 1–5 illustrate a series of steps in a process of fabricating items of material on a supporting substrate, in accordance with the present invention. Referring specifically to FIG. 1, a substrate 10 or base is illustrated with an upper surface. A conductive layer is positioned on the surface of substrate 10 and is patterned into strips 11 or rows in any convenient manner, such as mask and etch, mask and deposit, selective deposit, etc. A plurality of strips 11 extend parallel and horizontally in rows and each serve as one terminal for all devices in the row in a well known manner. A layer 12 of dielectric material, such as a nitride or oxide, is deposited over strips 11 and may be, for example, a blanket layer over the entire base 10. Cavities 12A, 12B, and 12C are defined in layer 12 by masking and etching, or any other convenient method, to expose portions of the surface of strips 11.

As will be explained in more detail presently, the size of cavities 12A, 12B, and 12C is a large factor in the current carrying characteristics of the items to be fabricated on the substrate. Accordingly, as will be understood, the size and shape of cavities 12A, 12B, and 12C can be adjusted during the definition to compensate for differences in conduction or emission characteristics of the items to be fabricated. Cavities 12A, 12B, and 12C can have substantially any desired shape (in the plane of the layer 12), including round, square, oval, etc.

In this specific embodiment, the entire structure illustrated in FIG. 1 is considered a supporting substrate 13 for purposes of the remaining disclosure. It should be understood that for purposes of this disclosure the term "supporting substrate" includes any structure provided to support the items being fabricated and may, for example, include a glass plate, a quartz plate, a plastic plate, a semiconductor chip, a semiconductor chip with integrated circuits formed thereon, a semiconductor chip with additional layers of material formed thereon, etc. Also, the structure of FIGS. 1-5 represents a two dimensional matrix including rows and columns of devices (e.g. pixels) with a single device broken out and explained to simplify this disclosure. Those skilled in the art will also understand that the specific matrix illustrated is for purposes of explanation and many changes and modifications can be devised.

Figure 2:
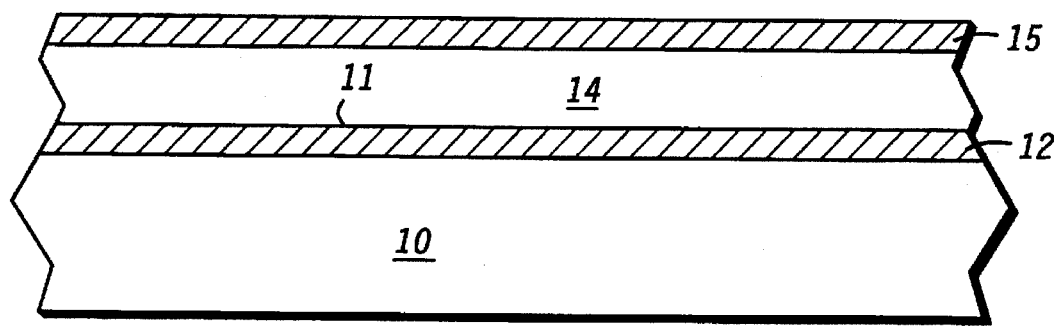

Referring now to FIG. 2, a layer 14 of removable material, such as undeveloped photoresist or the like, is positioned on surface 11 of supporting substrate 13 by any convenient method. A layer 15 of sufficiently rigid material, such as metal, is positioned on layer 14. Generally, both layers 14 and 15 are simply blanket layers that cover supporting substrate 13 entirely and are deposited in any of the many well known methods which are compatible with the specific method and equipment being utilized.

Figure 3:
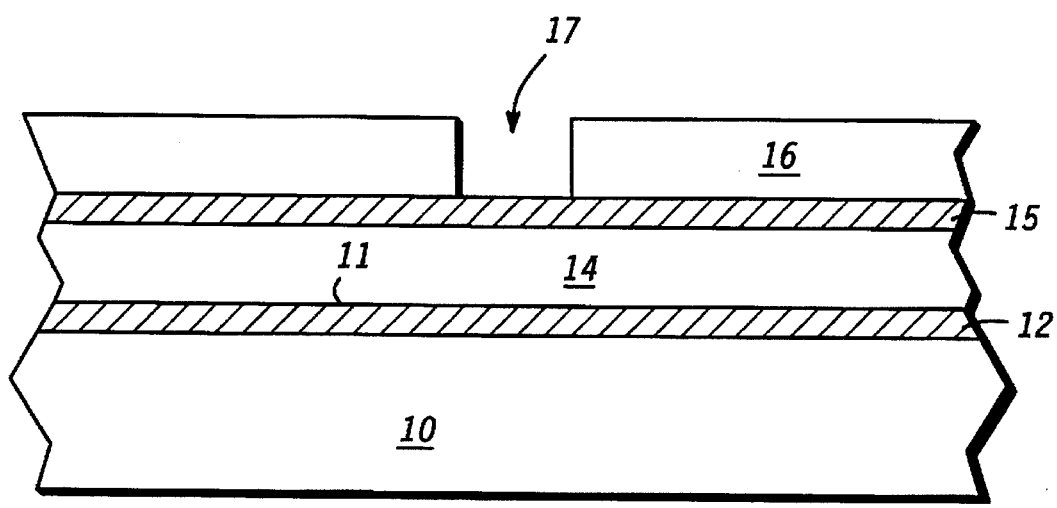
Figure 4:
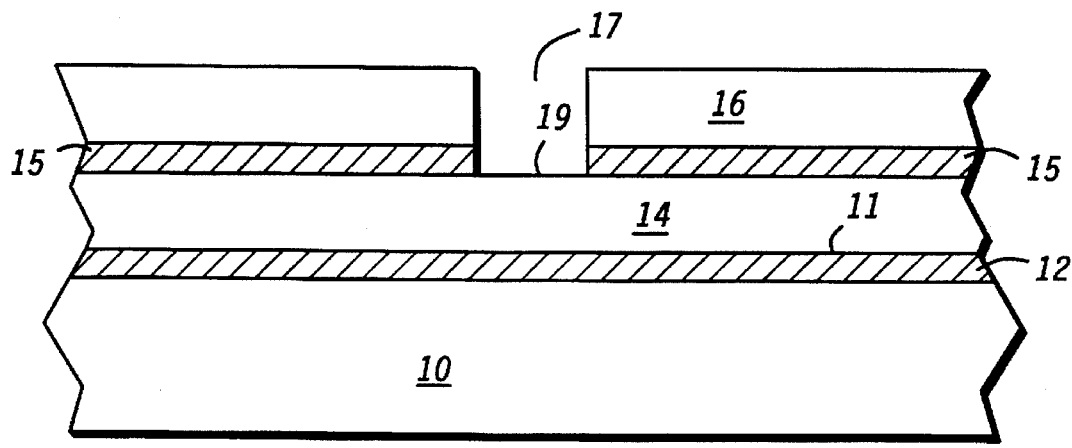

A layer 16 of photoresist is deposited on the surface of layer 15 and patterned by any convenient method to form a mask, illustrated in FIG. 3. Layer 16 has defined therein an opening 17 which exposes a portion of the surface of layer 15. The exposed portion of layer 15 is then etched to form an aperture 19 therein, as illustrated in FIG. 4, by any convenient etching material, which generally is determined by the material composing layer 15. Aperture 19 has a transverse dimension $W_1$ greater than the transverse dimension of cavity 12A and approximately equal to the width of one of the items of material to be deposited, which will be explained presently. The dimension perpendicular to the plane of the paper depends upon the shape of cavities 12A, 12B, and 12C and may be, for example, the same as $W_1$ if cavities 12A, 12B, and 12C are square. Once aperture 19 is properly defined in layer 15, layer 16 is exposed and developed away along with portions of layer 14 not covered by layer 15. Portions of layer 14 are then removed from under layer 15, as illustrated in FIG. 5, by any convenient method, such as oxygen plasma, chemical etching, expose and develop, etc.

The lateral undercutting of layer 15 defines an opening 20 in layer 14, having a transverse dimension $W_2$ greater than the transverse dimension $W_1$ of aperture 19, exposing a portion of the surface of supporting substrate 13 including cavities 12A, 12B, and 12C. It should be noted that layer 15 must be sufficiently rigid to maintain the overhang therein and to withstand subsequent processing, to be explained. While layer 15 could be a variety of different metals or combinations of metals, one specific example of a metal that has adequate characteristics and is easy to work with is gold. In this embodiment, transverse dimension $W_2$ of opening 20 is chosen to provide a non-shadow area 21 surrounding cavity 12A, a shadow area 22 surrounding cavity 12B, and a shadow area 23 surrounding cavity 12C. Further, areas 22 and 23 are slightly larger than area 21 for purposes that will become apparent as this description proceeds.

Figure 5:
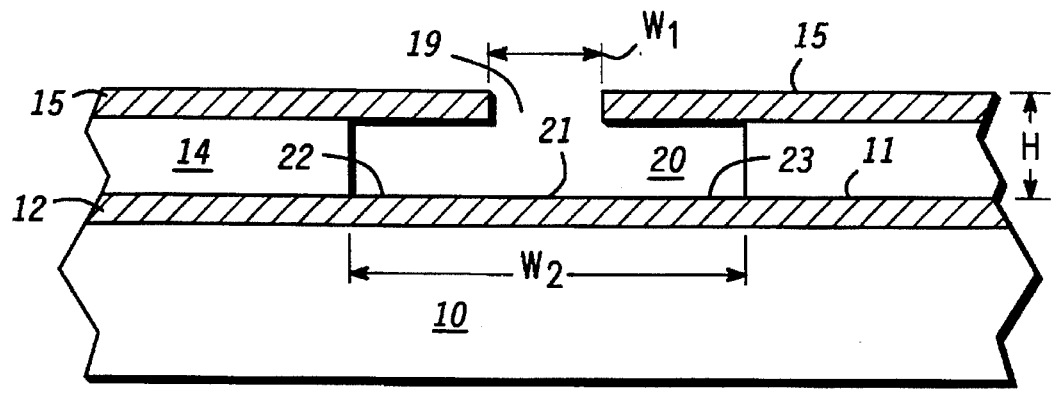
Figure 6:
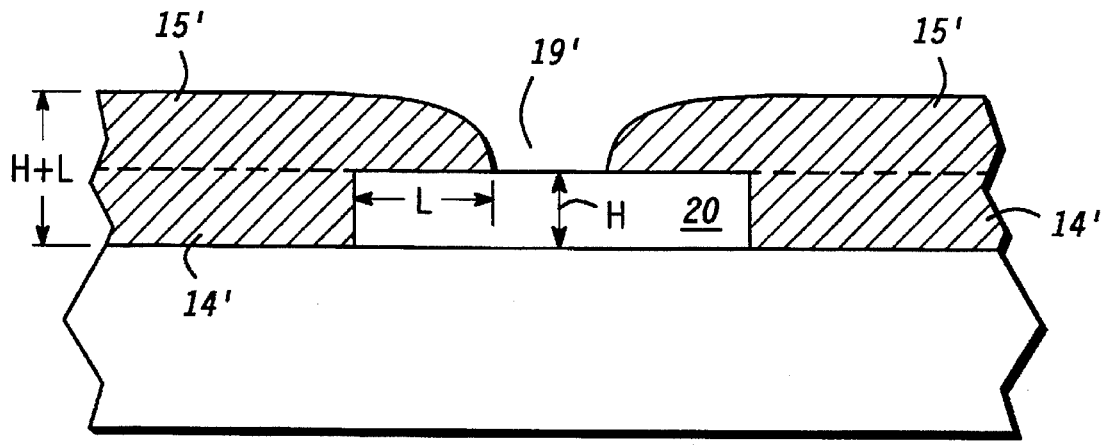
FIG. 6 illustrates another embodiment of a mask similar to FIG. 5.

In a slightly different embodiment, a structure (not shown) similar to that of FIG. 5 can be constructed by laying down a portion of photoresist 20' approximately the dimensions of opening 20, as illustrated in FIG. 6. Metal is then plated on each side of the photoresist and partially over the upper surface to define an aperture 19'. Aperture 19' is conveniently defined because the metal will extend onto the upper surface of photoresist 20' a distance L approximately equal to the height (H+L) of the metal above photoresist 20'. Photoresist 20' is then exposed and developed away to leave an opening and overhang similar to that illustrated in FIG. 5. In this structure a first layer 14' of material defining the opening and a second layer 15' of overhanging material overhang defining aperture 19' are formed of the same material.

Figure 7:
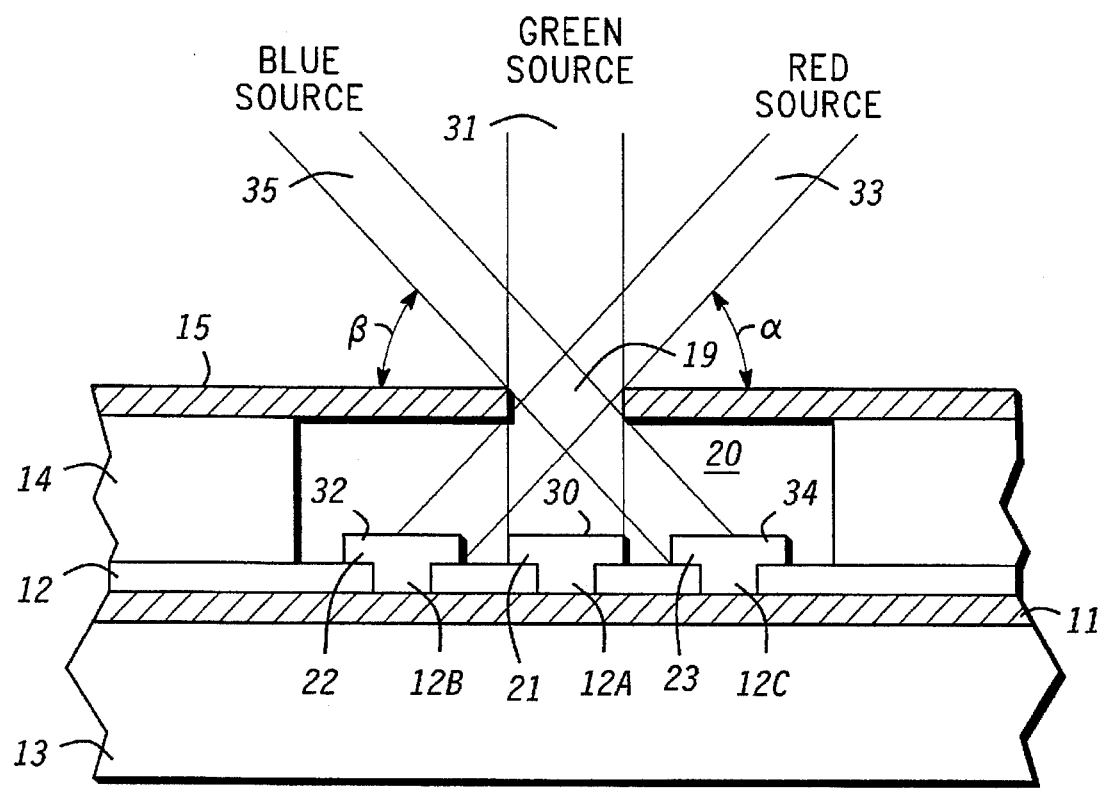
FIG. 7 is a simplified sectional view illustrating the deposition of color diodes of organic material systems in accordance with the present invention.

Referring now to FIG. 7, continuing steps in a process of fabricating items of material on supporting substrate 13 are illustrated. Utilizing the shadow mask of FIG. 5, an item 30 of a first material system is deposited over cavity 12A in area 21 of opening 20 by directing the material from a source 31 generally perpendicular to aperture 19. Because aperture 19 is larger than cavity 12A, item 30 will extend outwardly beyond cavity 12A onto the surface of layer 12 and, therefore, if item 30 includes a plurality of layers of material (e.g. an organic diode) the layers will not be shorted by conductive layer 11. An item 32 of a second material system is deposited over cavity 12B in area 22 of opening 20 by directing the material from a source 33 at a first angle $\alpha$ to aperture 19. Also, an item 34 of a third material system is deposited over cavity 12C in area 23 of opening 20 by directing the material from a source 35 at a second angle $\beta$ to aperture 19. In a specific example, the material of sources 31, 33, and 35 are evaporated in a vacuum chamber at a distance from aperture 19 sufficiently far so that the particles emanating from sources 31, 33, and 35 appear to move toward aperture 19 and the target (supporting substrate 13) in generally parallel lines (similar to a point or line light source, or collimated light).

It will be understood by those skilled in the art that angles $\alpha$ and $\beta$ can be accurately determined by knowing the transverse dimension $W_1$ of aperture 19 and the height h above the surface 11 of supporting substrate 13. Generally, angles $\alpha$ and $\beta$ will be in a range of approximately 30° to 50°, although this range and/or the specific angle can be selected or predetermined by adjusting the thickness of layer 14. Also, the transverse dimension $W_1$ of aperture 19 determines the width of item 30 and it is desirable to make both items 32 and 34 approximately the same width as item 30, even though the dimensions of cavities 12A, 12B, and 12C may be different. Thus, it can be seen that by accurately determining the height h, items 30, 32, and 34 are positioned in opening 20 in parallel spaced apart relationship with a space therebetween sufficient to prevent electrical interconnection. It should be understood that the order in which items 30, 32, and 34 are deposited is not crucial and the order described either in this disclosure or in the claims in not intended in any way to limit the scope of this invention.

Figure 8:
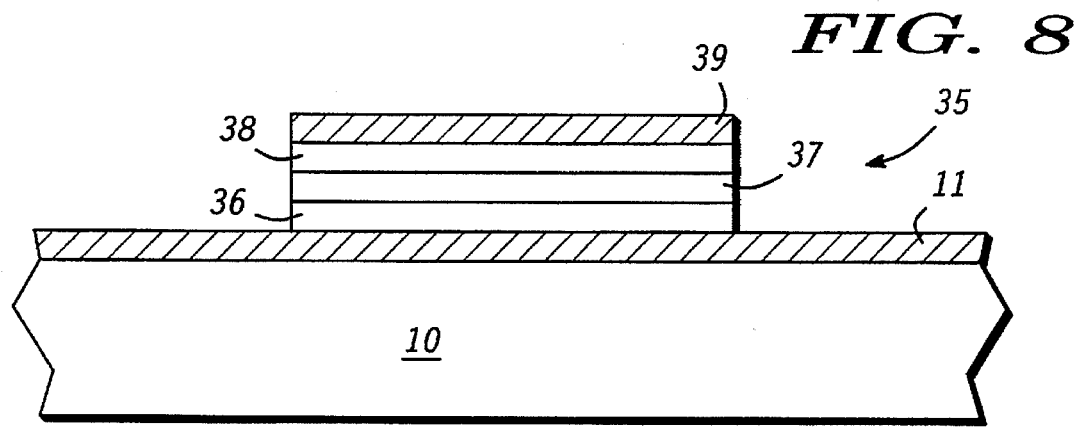
FIG. 8 is a simplified sectional view of a typical organic light emitting diode.

In a preferred embodiment, each material system forming items 30, 32, and 34 includes materials to form an organic light emitting diode. A sectional view of an organic light emitting diode 35, which may be utilized for this purpose, is illustrated in FIG. 8. Light emitting diode 35 is formed on substrate 10 with conducting layer 11 as a first electrode. A hole transporting layer 36 is positioned on layer 11, a light emitting layer 37 is positioned on layer 36, an electron transporting layer 38 is positioned on layer 37, and a second terminal is formed by placing a conducting layer 39 on layer 38, to completes the diode. Those skilled in the field of organic light emitting diodes will understand that various combinations of hole injecting and transporting zones and electron injecting and transporting zones can be utilized to form diodes from different materials. It is, however, generally necessary to utilize as a minimum two electrodes and a light emitting layer therebetween.

Figure 9:
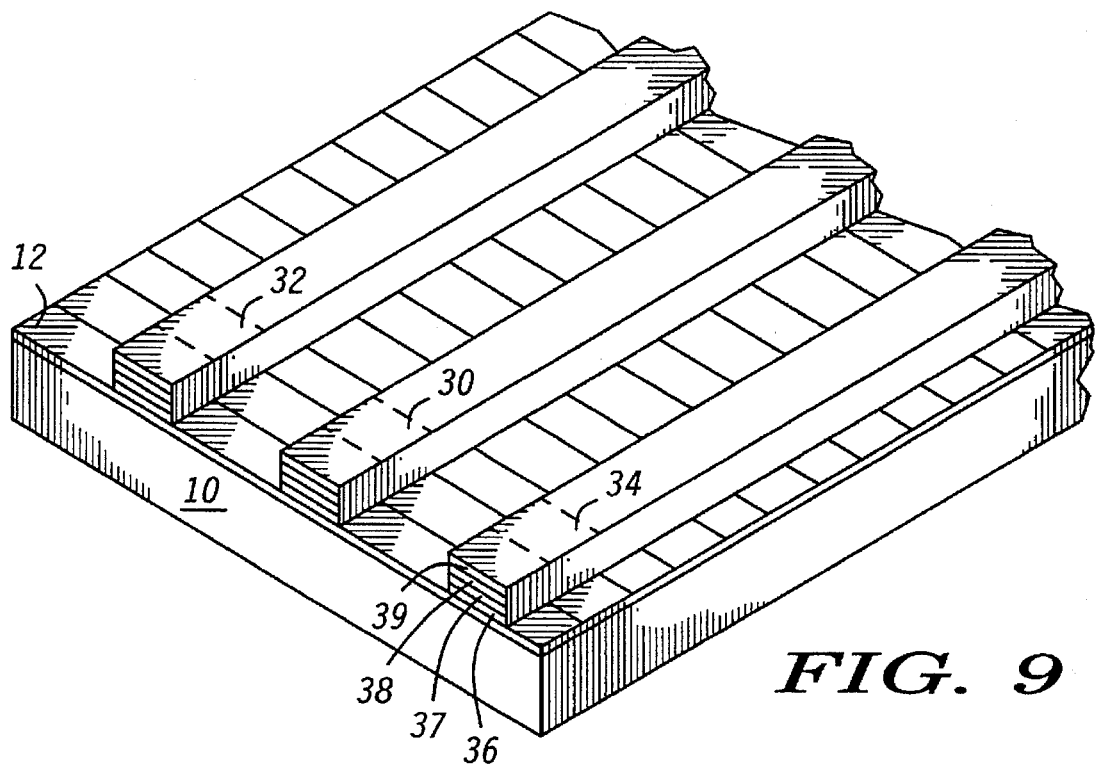
FIG. 9 is a perspective view illustrating a simplified matrix of organic light emitting diodes, portions thereof broken away.

In the structure of FIG. 7, source 31 is utilized to deposit a material system resulting in a green light emitting organic diode. Similarly, source 33 is utilized to deposit a material system resulting in a red light emitting organic diode and source 35 is utilized to deposit a material system resulting in a blue light emitting organic diode. It will of course be understood that the various sources 31, 33, and 35 could be interchanged or substituted with other sources, if desired or convenient. Thus, the three items 30, 32 and 34 can be utilized as a single pixel in a full color display. A perspective view of the matrix is illustrated in FIG. 9, showing how such three color pixels are separated into columns. It will of course be understood that only two items and two colors could be used in simpler matrices or all of the items 30, 32, and 34 can be formed to generate the same color light (e.g. a monochrome display).

As will be understood by those skilled in the art, the amount of electrical current which can be conducted through organic light emitting diode 35 (and many other electrical items) is dependent upon the area of layer 36 in contact with conductive layer 11. Also, it will be understood by those skilled in the art that all color light emitting diodes do not emit with the same intensity. Thus, it should be noted that the present invention is especially well adopted to compensate for such exigencies, since the horizontal dimensions of cavities 12A, 12B, and 12C can easily be selected to provide different amounts of current to each diode to allow for differences in emission intensity.

Figure 10:
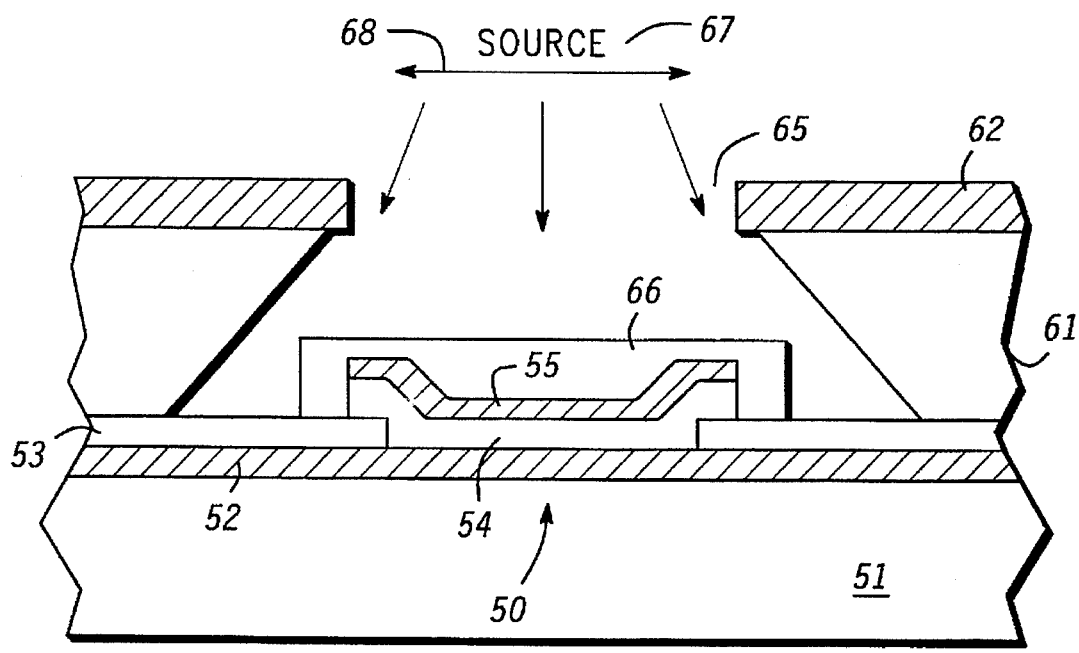
FIG. 10 is a simplified sectional view of apparatus for the deposition of an item and the passivation of the deposited item in accordance with the present invention.

Referring specifically to FIG. 10, a method of passivating an item of material positioned on a supporting substrate is illustrated. While the item to be passivated may be virtually any material or electronic device, in this specific example the item is a light emitting diode 50 formed on a supporting substrate 51, which in this embodiment is a light transmitting material such as glass or the like. Diode 50 includes a first conductive strip of material 52, which may be for example indium-tin-oxide (ITO) or the like, positioned on the upper surface of substrate 51. A dielectric layer 53, of some insulating material such as silicon nitride or the like, is positioned on material 52 and patterned to define a restraining opening for diode 50.

As previously described in conjunction with FIG. 5 a shadow mask 60 is formed over the restraining opening. A first layer 61 of photoresist is deposited on layer 53 and a metal layer 62 is deposited on layer 61. A second layer of photoresist (not shown) is deposited on the surface of layer 62 and patterned by any convenient method to form a mask. The second layer of photoresist has defined therein an opening which is approximately the desired width of diode 50 and directly overlying the restraining opening in layer 53. The exposed portion of metal layer 62 is then etched to form an aperture 65 therein, as illustrated in FIG. 10. Once aperture 65 is properly defined in layer 62, the layer of photoresist is exposed and developed away along with portions of layer 61 not covered by layer 62. Portions of layer 61 are then removed from under layer 62, as illustrated in FIG. 10, by any convenient method, such as oxygen plasma, chemical etching, expose and develop, etc.

Utilizing the shadow mask of FIG. 10, diode 50 is then formed by depositing a layer 54 of organic light emitting material on conductive material 52 in the restraining opening. A layer 55 of metal, generally n-type conductive metal, is positioned on layer 54 to complete diode 50. A layer 66 of passivation material is deposited on diode 50 by directing the material from a source 67 generally perpendicular to aperture 65. In a specific example, the material of source 67 is evaporated in a vacuum chamber at a distance from aperture 65 which may be similar to or somewhat closer than that described previously for depositing the parallel items. Also, source 67, or substrate 51 if convenient, is dithered transversely, as indicated by arrow 68, (or rotated) to ensure a complete coating of material over the entire surface of diode 50. The specific amount of dithering and the distance over which the dithering occurs depends upon the height of diode 50 and the transverse dimension of aperture 65. Thus, diode 50 is fabricated and passivated utilizing the same shadow mask and with no added alignment or masking requirements.

Figure 11:
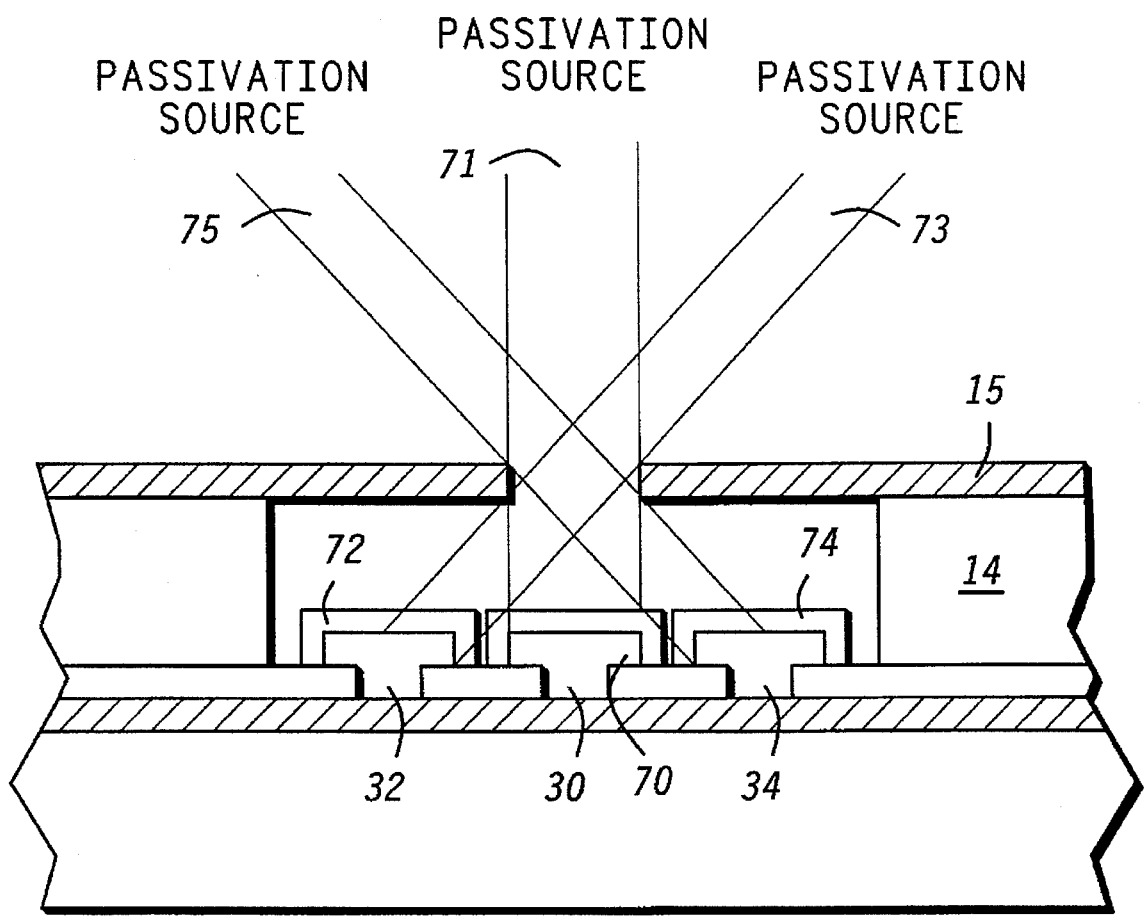
FIG. 11 is a simplified sectional view of apparatus for the passivation of color diodes of organic material systems, similar to those illustrated in FIG. 7, in accordance with the present invention.
Figure 1:
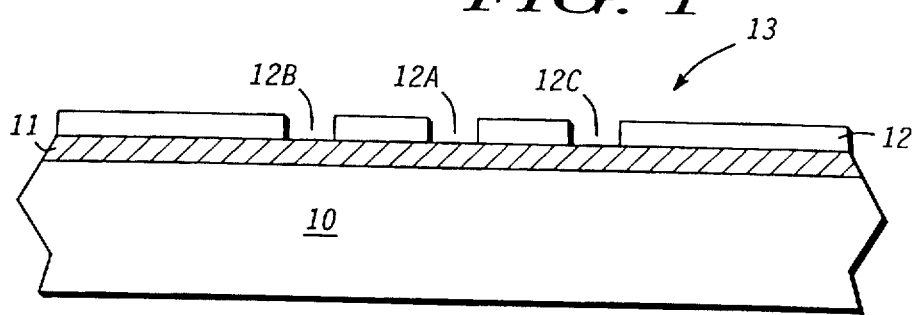
Figure 2:
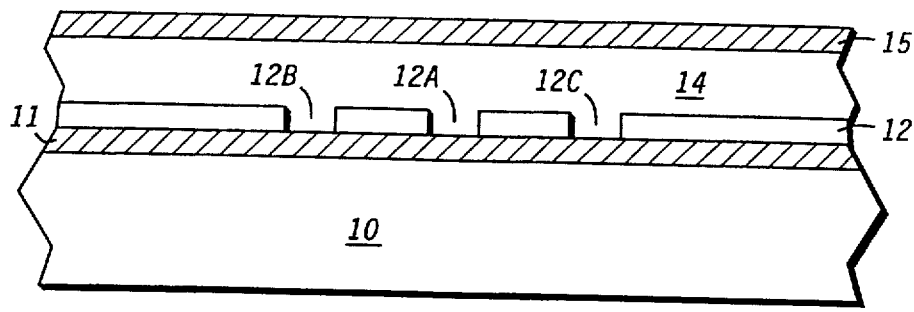
Figure 3:
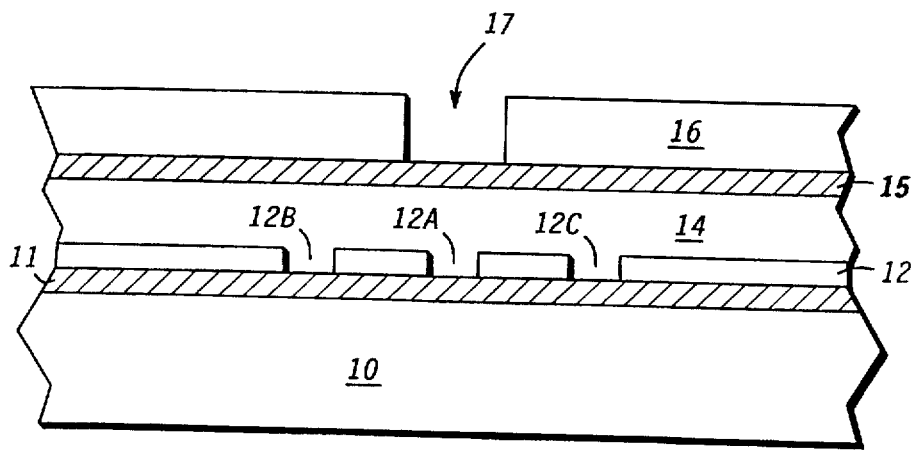
Figure 4:
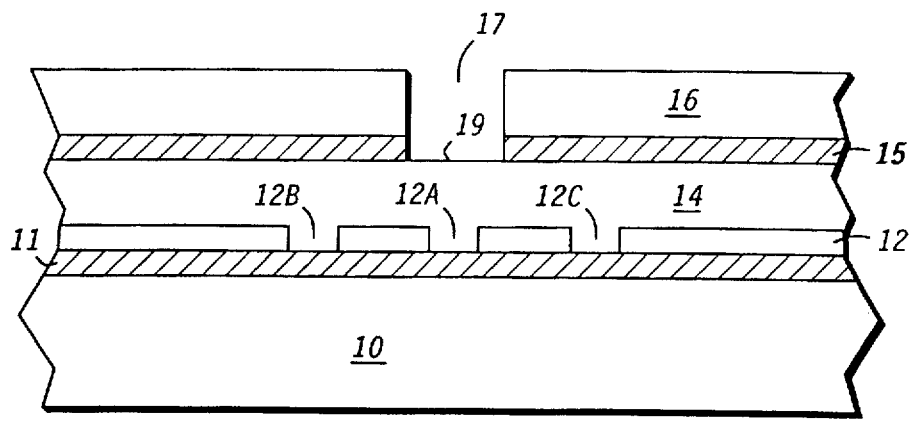
Figure 5:
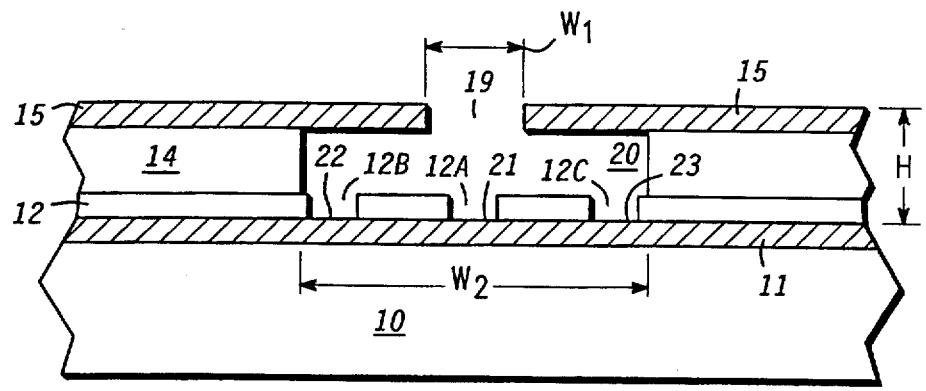
Figure 6:
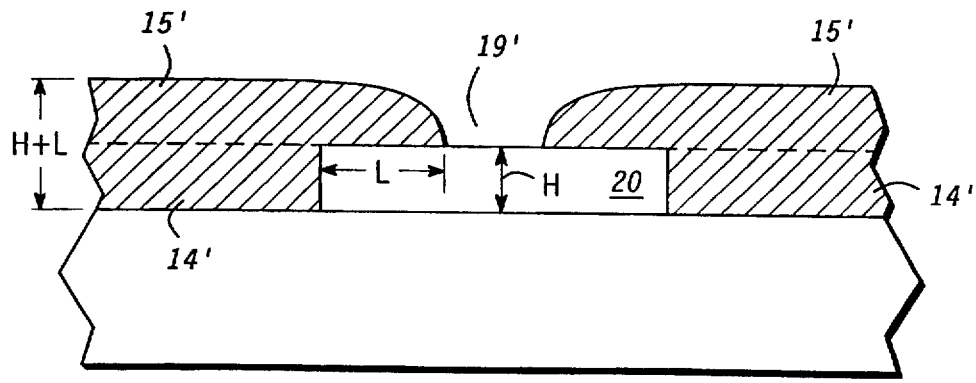
Figure 7:
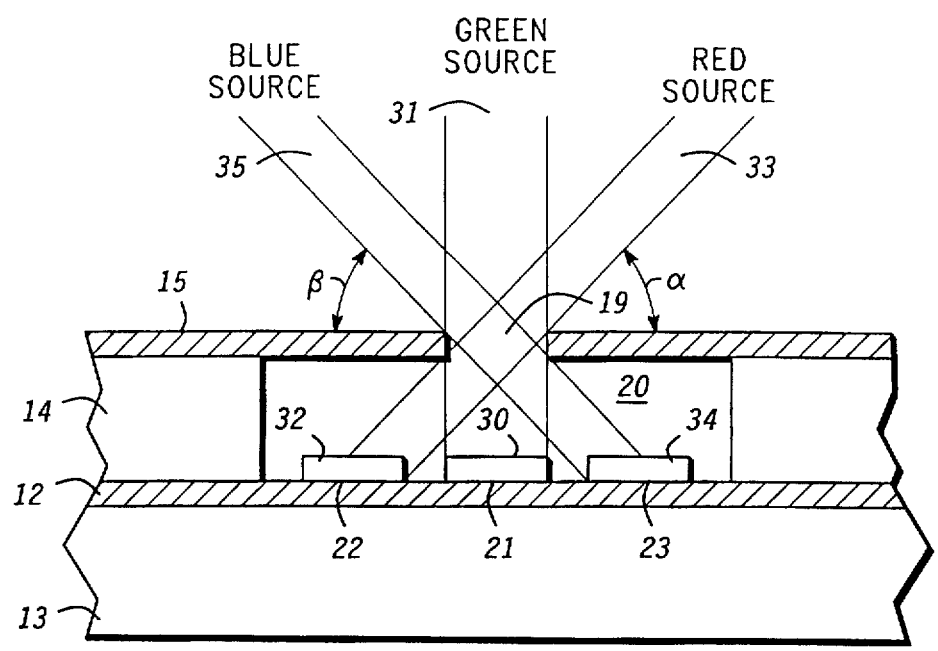
Figure 8:
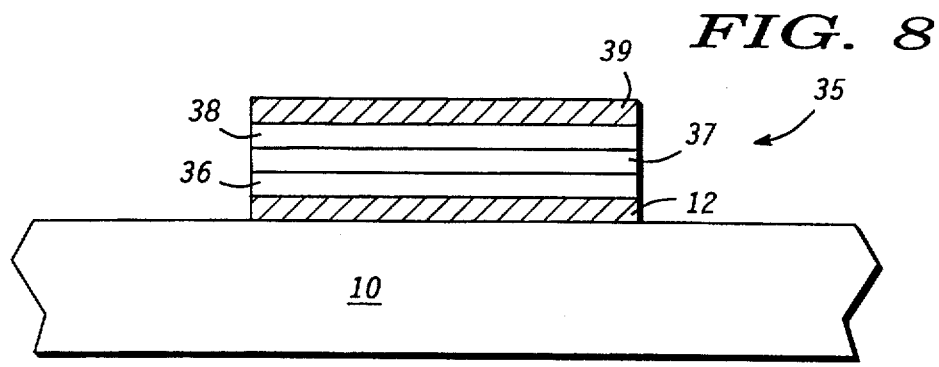
Figure 9:
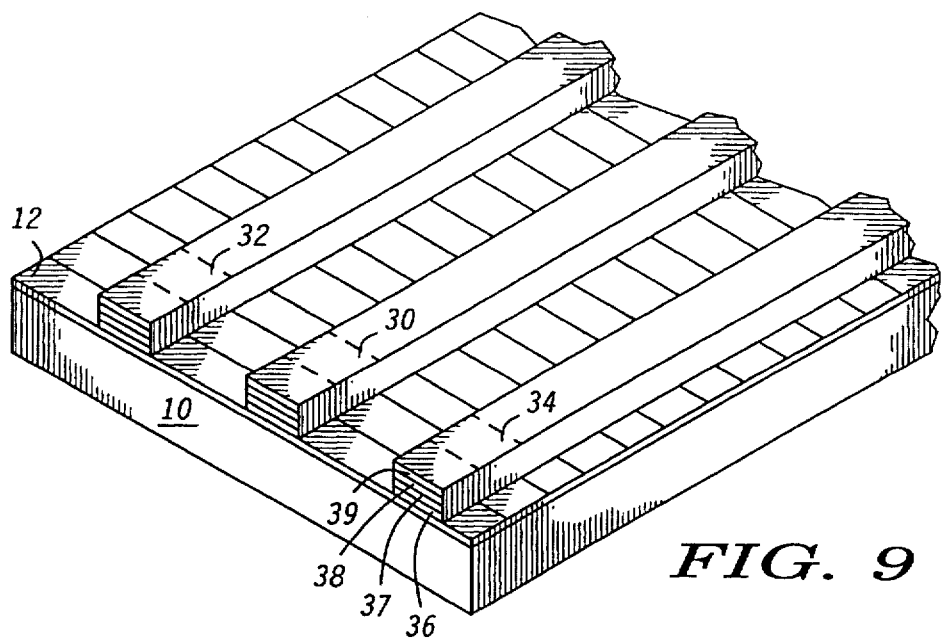
Figure 10:
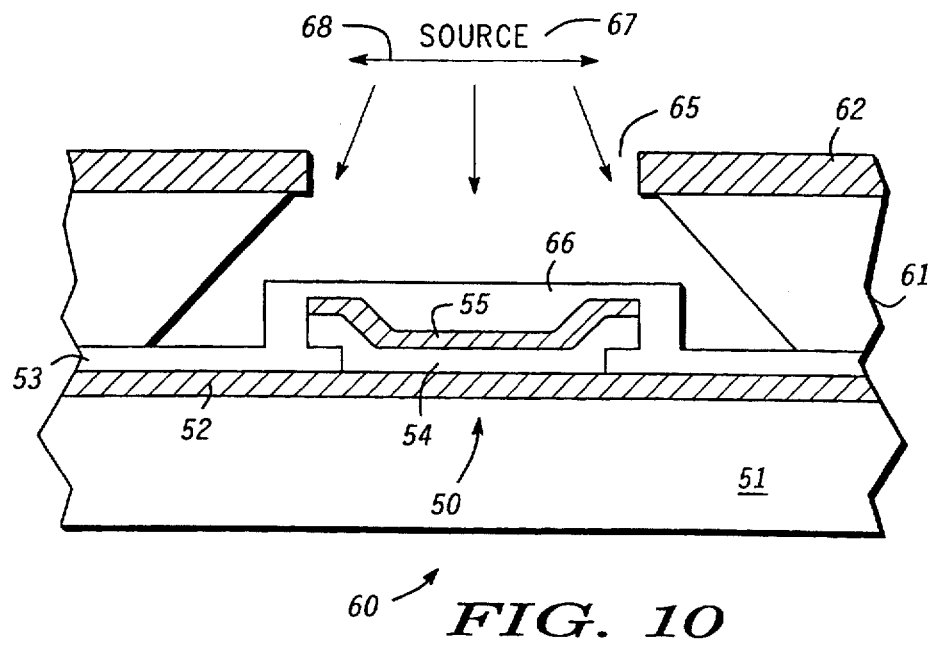
Figure 11:
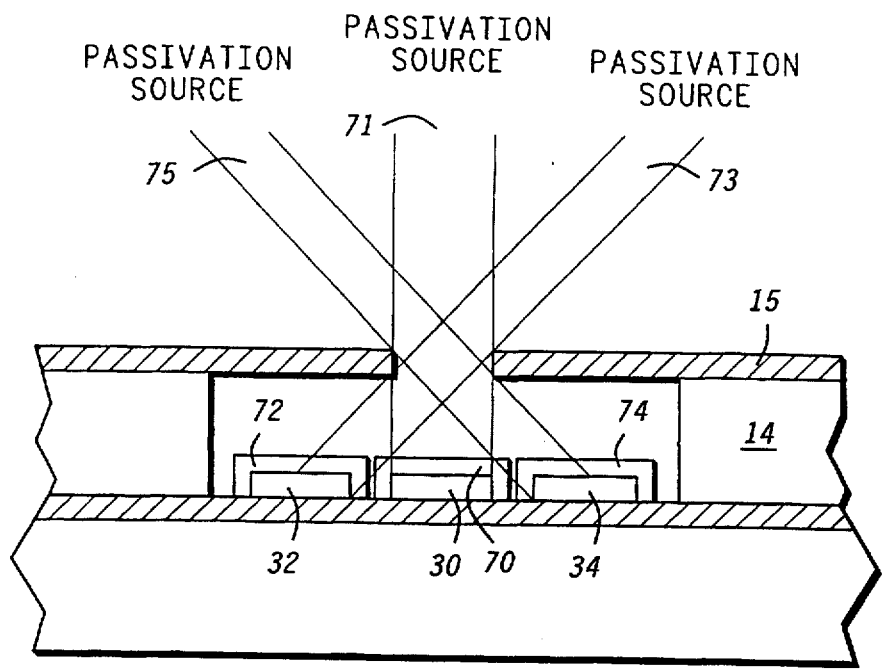

Referring now to FIG. 11, the structure of FIG. 7 is illustrated with items 30, 32, and 34 already deposited. Utilizing the shadow mask which is already in place, a first passivation layer 70 is deposited over item 30 by directing the material from a distally positioned source 71 generally perpendicular to aperture 19. A passivation layer 72 is deposited over item 32 by directing the passivation material from a source 73 at a first angle α to aperture 19. Also, a passivation layer 74 is deposited over item 34 by directing the passivation material from a source 75 at a second angle β to aperture 19. It will of course be understood that passivation sources 71, 73, and 75 can simply replace green, red, and blue sources 31, 33, and 35. As described above, passivation sources 71, 73, and 75 are dithered slightly about the perpendicular, angle α, and angle β, respectively, to ensure complete coverage and passivation of items 30, 32, and 34.

Once the passivation is complete, layer 14 can be partially or completely dissolved and layer 15 can simply be lifted off. In some applications, layers 14 and 15 can be lifted off simultaneously and with no dissolving required, by utilizing, for example, adhesive tape or the like. The single mask is utilized for both the patterning of the matrix of organic diodes onto the supporting substrate and the passivation of the organic diodes. Since the passivation layers 70, 72, and 74 do not contact each other, they can be formed of a hermetically sealing metal, which metal can also be used as the second electrical terminal for each organic diode.

Thus, a new and improved method of fabricating single items or complete organic LED matrices has been disclosed and of passivating the single item or complete organic LED matrices with one lithographic step. The new and improved method of fabricating and/or passivating items or organic LED matrices is relatively easy and inexpensive, and is capable of producing relatively accurate items of material for high resolution displays. Further, the new and improved method of fabricating and/or passivating organic LED matrices is capable of producing matrices with reduced weight and thickness. As a further major advantage, the patterning and passivation allows the use of solvent for lift off of the single mask (or simply lift off) so that no complicated and damaging steps, such as etching and the like, are involved. Also, the complete fabrication and passivation is performed without involving any high temperature processes after the deposition of the organic materials.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

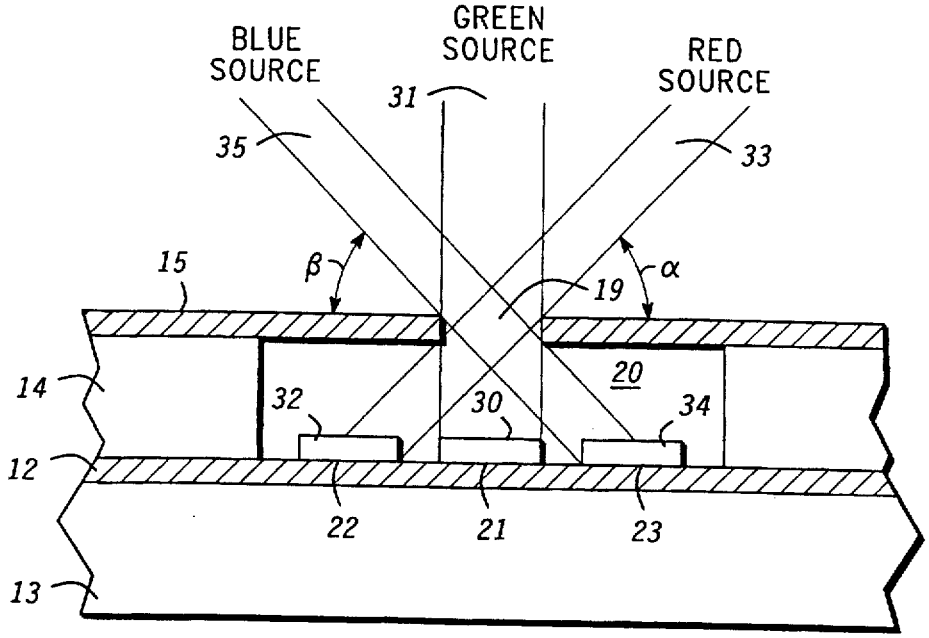

What is claimed is:

1. A method of patterning items of material on a supporting substrate comprising the steps of:

providing a supporting substrate with first and second laterally spaced apart conducting areas defined on the substrate, the first and second conducting areas defining first electrical contacts;

forming a first layer of removable material on the substrate and a second layer of removable material on the first layer of removable material;

forming an aperture through the second layer of removable material overlying the first conducting area and forming an opening through the first layer of removable material positioned between the aperture and the first and second conducting areas, remaining portions of the first layer of removable material defining the opening therein with a first transverse dimension exposing a portion of the surface of the substrate and remaining portions of the second layer of removable material defining the aperture therethrough with a second transverse dimension, smaller than the first transverse dimension, the second layer of removable material overlying a portion of the exposed surface of the substrate in the opening so as to divide the exposed surface of the substrate into a shadow area surrounding the first conducting area and a non-shadow area surrounding the second conducting area; and depositing a first material system, including a light emissive material and a second electrical contact, by evaporating the first material system in a vacuum chamber at a distance from the aperture so that evaporated particles of the first material system move toward the exposed surface of the substrate in generally parallel lines which are generally perpendicular to the aperture to form a first multi-layered electrical device of the first material system on the second conducting area of the surface of the substrate in the non-shadow area and depositing a second material system, including a light emissive material and a second electrical contact, by evaporating the second material system in a vacuum chamber at a distance from the aperture so that evaporated particles of the second material system move toward the exposed surface of the substrate in generally parallel lines which are at an angle to the aperture to form a second multi-layered electrical device of the second material system on the first conducting area of the surface of the substrate in the shadow area, the first and second multi-layered devices being laterally spaced apart in non-overlapping relationship; and removing the first and second layers of removable material from the substrate.

2. A method of patterning items of material on a supporting substrate as claimed in claim 1 wherein the step of depositing the first layer of removable material includes depositing a layer of photoresist material.

3. A method of patterning items of material on a supporting substrate as claimed in claim 1 wherein the step of forming the second layer of removable material includes depositing a first layer of metal on the layer of removable material.

4. A method of patterning items of material on a supporting substrate as claimed in claim 1 wherein depositing the first material system to form a first multi-layered electrical device and depositing the second material system to form a second multi-layered electrical device each include depositing a first material system forming a first color organic light emitting diode and depositing a second material system forming a second color organic light emitting diode.

5. A method of patterning items of material on a supporting substrate as claimed in claim 1 wherein the step of providing the supporting substrate with first and second laterally spaced apart conducting areas defined on the substrate includes providing a base with a conductive layer positioned thereon and an insulating layer positioned on the conducting layer and having cavities with selected horizontal dimensions defined therethrough to expose portions of the conductive layer, which exposed portions define the first and second laterally spaced apart conducting areas.

6. A method of patterning items of material on a supporting substrate as claimed in claim 5 wherein the step of providing the supporting substrate further includes selecting the horizontal dimensions of the cavities to determine the relative amounts of electrical conduction of the items, the electrical conduction being determined by the size of the first and second laterally spaced apart conducting areas.

7. A method of patterning items of material on a supporting substrate as claimed in claim 5 wherein depositing the first material system, and depositing the second material system, each include depositing an organic electron emitter material on the exposed portions of the conductive layers in the cavities and depositing a second layer of conductive material on the organic electron emitter material in an overlaping relationship to each of the cavities.

8. A method of patterning items of material on a supporting substrate as claimed in claim 7 wherein depositing the organic electron emitter material on the exposed layer of conductive material and the second layer of conductive material on the organic emitter material further includes depositing one of a hole transport layer between the exposed portions of conductive material and a layer of organic electron emitter material or an electron transport layer between the second layer of conductive material and the layer of organic electron emitter material.

9. A method of patterning items of material on a supporting substrate as claimed in claim 1 including, subsequent to the step of depositing the first and second material systems, the steps of depositing passivation material by evaporating the passivation material in a vacuum chamber at a distance from the aperture so that evaporated particles of the second material system move toward the exposed surface of the substrate in generally parallel lines which are generally perpendicular to the aperture to form a passivation cover on the first material system in the non-shadow area and depositing passivation material by evaporating the passivation material in a vacuum chamber at a distance from the aperture so that evaporated particles of the second material system move toward the exposed surface of the substrate in generally parallel lines which are at an angle to the aperture to form a passivation cover on the second material system in the shadow area.

10. A method of patterning items of material on a supporting substrate as claimed in claim 9 wherein the steps of depositing passivation material generally perpendicular to the aperture and depositing passivation material at an angle to the aperture each include dithering deposition sources about the perpendicular and the angle to form the passivation covers.

11. A method of patterning items of material on a supporting substrate as claimed in claim 1 wherein the steps of depositing the second material system at an angle to the aperture includes depositing the second material system at an angle dependent upon the second transverse dimension of the aperture and the depth of the opening.

12. A method of patterning three items of material on a supporting substrate comprising the steps of:

provding a supporting substrate with first, second and third laterally spaced apart conducting areas defined on the substrate, the first, second and third conducting areas each defining first electrical contacts;

forming a first layer of removable material on the substrate and a second layer of removable material on the first layer of removable material, forming an aperture through the second layer of removable material overlying the first conducting area and forming an opening through the first layer of removable material positioned between the aperture and the first, second and third conducting areas, remaining portions of the first layer of removable material defining the opening with a first transverse dimension therein exposing a portion of the substrate and remaining portions of the second layer of removable material defining therein the aperture with a second transverse dimension, smaller than the first transverse dimension, the second layer of removable material overlying portions of the exposed substrate in the opening so as to divide the exposed substrate, respectively, into a first shadow area surrounding the first conducting area, a non-shadow area surrounding the second conducting area, and a second shadow area surrounding the third conducting area; and evaporating a first material system, including a light emissive material and a second electrical contact, in a vacuum chamber at a distance from the aperture so that evaporated particles of the first material system move toward the exposed surface of the substrate in generally parallel lines which are generally perpendicular to the aperture to form an item of the first material system on the substrate in the non-shadow area, the first material system forming a first color organic light emitting diode;

evaporating a second material system, including a light emissive material and a second electrical contact, in a vacuum chamber at a distance from the aperture so that evaporated particles of the first material system move toward the exposed surface of the substrate in generally parallel lines which are at an angle to the aperture to form an item of the second material system on the substrate in the first shadow area, the second material system forming a second color organic light emitting diode; and evaporating a third material system, including a light emissive material and a second electrical contact, in a vacuum chamber at a distance from the aperture so that evaporated particles of the first material system move toward the exposed surface of the substrate in generally parallel lines which are at another angle to the aperture to form an item of the third material system on the substrate in the second shadow area, the third material system forming a third color organic light emitting diode;

the first color, second color and third color organic light emitting diodes being laterally spaced apart in non-overlapping relationship: and removing the first and second layers of removable material from the substrate.

13. A method of patterning items of material on a supporting substrate as claimed in claim 12 including, subsequent to the steps of evaporating first, second and third material systems and before the step of removing the first and second layers of material from the substrate, the steps of evaporating a passivation material in a vacuum chamber at a distance from the aperture so that evaporated particles of the first material system move toward the exposed surface of the substrate in generally parallel lines which are generally perpendicular to the aperture to form a passivation cover on the first material system in the non-shadow area, evaporating the passivation material in a vacuum chamber at a distance from the aperture so that evaporated particles of the first material system move toward the exposed surface of the substrate in generally parallel lines which are at an angle to the aperture to form a the passivation cover on the second material system in the first shadow area and evaporating passivation material in a vacuum chamber at a distance from the aperture so that evaporated particles of the first material system move toward the exposed surface of the substrate in generally parallel lines which are at another angle to the aperture to form a passivation cover on the third material system in the second shadow area.

14. A method of patterning items of material on a supporting substrate as claimed in claim 13 wherein the steps of evaporating the passivation material generally perpendicular to the aperture, evaporating the passivation material at an angle to the aperture and evaporating the passivation material at another angle to the aperture each include dithering evaporation sources about the perpendicular, the angle and the another angle to form the passivation covers.

15. A method of patterning items of material on a supporting substrate as claimed in claim 12 wherein the step of forming the second layer of removable material includes depositing a layer of metal on the first layer of removable material.

16. A method of patterning items of material on a supporting substrate as claimed in claim 12 wherein the step of providing the supporting substrate with first, second and third laterally spaced apart conducting areas defined on the substrate includes providing a base with a conductive layer positioned thereon and an insulating layer positioned on the conducting layer and having cavities with selected horizontal dimensions defined therethrough to expose portions of the conductive layer, which exposed portions define the first, second and third laterally spaced apart conducting areas.

17. A method of patterning items of material on a supporting substrate as claimed in claim 16 wherein the step of providing the supporting substrate further includes selecting the horizontal dimensions of the cavities to determine the relative amounts of electrical conduction of the items, the electrical conduction being determined by the size of the first, second and third laterally spaced apart conducting areas.

18. A method of patterning and passivating, on a supporting substrate, items of material systems including organic light emitters, comprising the steps of:

provniding a supporting substrate with first and second laterally spaced apart conducting areas defined on the substrate, the first and second conducting areas defining first electrical contacts;

forming a layer of removable material on the substrate and a layer of metal on the layer of removable material;

forming an aperture through the layer of metal overlying the first conducting area and forming an opening through the layer of removable material positioned between the aperture and the first and second conducting areas, remaining portions of the layer of removable material defining the opening therein with a first transverse dimension exposing a portion of the substrate and remaining portions of the layer of metal defining the aperture therethrough with a second transverse dimension, smaller than the first transverse dimension, the layer of metal overlying a portion of the substrate in the opening so as to divide the exposed substrate into a shadow area surrounding the first conducting area and a non-shadow area surrounding the second conducting area;

evaporating a first material system, including a light emissive material and a second electrical contact, in a vacuum chamber at a distance from the aperture so that evaporated particles of the first material system move toward the exposed surface of the substrate in generally parallel lines which are generally perpendicular to the aperture to form an item of the first material system including a first organic light emitter on the second conducting area of the substrate in the non-shadow area;

evaporating a second material system, including a light emissive material and a second electrical contact, in a vacuum chamber at a distance from the aperture so that evaporated particles of the second material system move toward the exposed surface of the substrate in generally parallel lines which are at an angle to the aperture to form an item of the second material system including a second organic light emitter on the first conducting area of the substrate in the shadow area, the first and second multi-layered devices being laterally spaced apart in non-overlapping relationship;

evaporating passivation material in a vacuum chamber at a distance from the aperture so that evaporated particles of the passivation material move toward the first material system in generally parallel lines which are generally perpendicular to the aperture to form a passivation cover on the first material system;

evaporating passivation material in a vacuum chamber at a distance from the aperture so that evaporated particles of the passivation material move toward the second material system in generally parallel lines which are at an angle to the aperture to form a passivation cover on the second material system; and removing the layer of removable material and the layer of metal on the layer of removable material.

* * * * *

UNITED STATES PATENT AND TRADEMARK OFFICE
CERTIFICATE OF CORRECTION

PATENT NO. : 5,641,611
DATED : June 24, 1997
INVENTOR(S) : Shieh et al.

It is certified that error appears in the above-identified patent and that said Letters Patent is hereby corrected as shown below:

The title page should be deleted to appear as per attached title page.

Please delete drawing sheets 1-5 and substitute drawing sheets 1-5 as per attached.

Signed and Sealed this

Twentieth Day of July, 1999

Attest:

*Attesting Officer*

Q. TODD DICKINSON

*Acting Commissioner of Patents and Trademarks*

United States Patent [19]
Shieh et al.

[11] Patent Number: 5,641,611
[45] Date of Patent: Jun. 24, 1997

[54] METHOD OF FABRICATING ORGANIC LED MATRICES

[75] Inventors: Chan-Long Shieh, Paradise Valley, Ariz.; Hsing-Chung Lee, Calabasas, Calif.

[73] Assignee: Motorola, Schaumburg, Ill.

[21] Appl. No.: 517,223

[22] Filed: Aug. 21, 1995

[51] Int. Cl.⁶ .................. B05D 1/32; G03C 5/56
[52] U.S. Cl. .................. 438/35; 430/23; 430/29; 430/315; 430/324; 430/321; 437/80; 437/89; 437/905; 437/944; 257/40; 257/89; 257/79; 427/468; 427/487; 427/66; 427/68; 427/69; 427/155; 427/162; 427/251; 427/261; 427/615; 427/282; 438/99; 438/38
[58] Field of Search .................. 437/1, 80, 89, 437/905, 944; 257/40, 79, 89, 88; 427/468, 466, 487, 66, 68, 69, 99, 155, 162, 256, 259, 261, 265, 282; 430/314, 315, 320, 321, 324, 23, 24, 29

[56] References Cited

U.S. PATENT DOCUMENTS

| | | | |
|---|---|---|---|
| 4,459,321 | 7/1984 | Kim | 427/255.7 |
| 4,469,719 | 9/1984 | Martin | 427/282 |
| 4,599,790 | 7/1986 | Kim et al. | 148/DIG. 143 |
| 4,728,519 | 3/1988 | Tanimoto | 427/66 |
| 4,771,017 | 9/1988 | Tobin et al. | 148/DIG. 100 |
| 4,883,770 | 11/1989 | Dohler et al. | 437/80 |
| 5,105,238 | 4/1992 | Nikaido et al. | 357/19 |
| 5,276,380 | 1/1994 | Tang | 313/504 |
| 5,349,203 | 9/1994 | Hanazato et al. | 257/40 |
| 5,473,047 | 12/1995 | Shi | 528/310 |

FOREIGN PATENT DOCUMENTS 58-68835  4/1983  Japan ................ 427/68

OTHER PUBLICATIONS

Elliot, David. "Integrated Circuit Fabrication Technology", ©1982 pp. 26–33.
IBM Tech. Discl. Bull. vol. 27, No. 5, (Oct. 1984) pp. 3026–3027.

*Primary Examiner*—Martin Angebranndt
*Attorney, Agent, or Firm*—Eugene A. Parsons

[57] ABSTRACT

Items of material are patterned on a substrate by forming a layer of photoresist on the substrate and a layer of metal on the photoresist. The photoresist is patterned to define an opening exposing a portion of the substrate and the metal is patterned to define an aperture smaller than the opening so as to divide the exposed surface of the substrate into shadow areas and a non-shadow area. A first material system is evaporated generally perpendicular to the aperture to form a first organic light emitting diode on the surface of the substrate in the non-shadow area and second and third material systems are evaporated at angles to the aperture to form second and third organic light emitting diodes in the shadow areas. Passivation material is evaporated perpendicularly onto the first diode and at the angle onto the second diode.

18 Claims, 5 Drawing Sheets